(12) United States Patent
Hsueh

(10) Patent No.: US 7,381,982 B2
(45) Date of Patent: Jun. 3, 2008

(54) METHOD FOR FABRICATING CHALCOGENIDE-APPLIED MEMORY

(75) Inventor: Ming-Hsiang Hsueh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/213,533

(22) Filed: Aug. 26, 2005

(65) Prior Publication Data
US 2007/0045605 A1 Mar. 1, 2007

(51) Int. Cl.
*H01L 47/00* (2006.01)
(52) U.S. Cl. .................. 257/4; 257/3; 257/E45.001; 438/900
(58) Field of Classification Search .................. 257/3, 257/4, 295, 296, E29.17, E45.002, E27.004; 438/900
See application file for complete search history.

(56) References Cited

U.S. PATENT DOCUMENTS

| 5,296,716 A | 3/1994 | Ovshinsky et al. |
| 5,687,112 A | 11/1997 | Ovshinsky et al. |
| 5,789,277 A | 8/1998 | Zahorik et al. |
| 6,348,365 B1 | 2/2002 | Moore et al. |
| 6,545,903 B1 | 4/2003 | Wu |
| 6,746,892 B2* | 6/2004 | Lee et al. ..................... 438/95 |
| 6,830,952 B2 | 12/2004 | Lung |
| 2006/0012008 A1* | 1/2006 | Campbell ..................... 257/536 |
| 2006/0186440 A1* | 8/2006 | Wang et al. .................. 257/246 |

* cited by examiner

*Primary Examiner*—Thomas L Dickey
*Assistant Examiner*—Fazli Erdem
(74) *Attorney, Agent, or Firm*—Clark A. Jablon; Yitai Hu; Akin Gump Strauss Hauer & Feld

(57) ABSTRACT

A chalcogenide memory cell includes a lower electrode, a chalcogenide layer, and an upper electrode. The lower electrode includes a tapered cavity. The chalcogenide layer is formed in the tapered cavity of the lower electrode. One side of the chalcogenide layer is adjacent to the lower electrode. The upper electrode is formed in a second cavity formed by the chalcogenide layer so that the upper electrode substantially fills the second cavity. The upper electrode is adjacent to the other side of the chalcogenide layer. Information is stored and retrieved by passing current between the upper electrode and the lower electrode. The tapered cavity of the lower electrode is formed through anisotropic etching or through sidewall-application. Undesired currents are prevented using an additional dielectric layer or by using an additional conductive layer that forms a p-n junction with the lower electrode.

20 Claims, 22 Drawing Sheets

METHOD FOR FABRICATING CHALCOGENIDE-APPLIED MEMORY

BACKGROUND OF THE INVENTION

Embodiments of the present invention relate to methods for fabricating chalcogenide memory. More particularly, embodiments of the present invention relate to methods for decreasing the contact area and forming the isolation of a chalcogenide memory cell.

Multimedia applications for communication devices, computers, and consumer electronics are increasing the demand for memory devices. These applications are also increasing the requirements the memory devices must meet. Increased memory device requirements include but are not limited to high density, non-volatility, fast access speeds, low power consumption, and good endurance. Memory device technologies currently being developed to satisfy these requirements include but are not limited to flash, magnetic or magnetoresistive random access memory (MRAM), ferroelectric random access memory (FeRAM), and chalcogenide memory. Chalcogenide memory can include but is not limited to Ovonic Unified Memory™ (OUM™), from ECD Ovonics of Rochester Hill, Mich., for example. Chalcogenide memory is a particularly promising technology due to its low cost, manufacturability, electrically writeable and directly erasable low input energies, multi-bit capability, non-volatility, and very high packing density.

Chalcogenide materials are materials that can be electrically switched from a generally amorphous state, to a generally crystalline state, and back to a generally amorphous state. Chalcogenide materials exhibit different electrical characteristics depending on their state. For example, a chalcogenide material exhibits lower electrical conductivity in its amorphous state than it does in its crystalline state. The switching and electrical characteristics of chalcogenide devices make chalcogenide materials useful in fabricating memory devices.

A memory device made from a chalcogenide material generally includes a lower electrode, a thin film of chalcogenide material, an upper electrode, and a dielectrics material for isolation from other memory devices. The chalcogenide material is the memory element of the memory device. The operation and use of chalcogenide materials as memory devices has been described, for example, in U.S. Pat. No. 5,296,716 to Ovshinsky et al., the disclosure of which is incorporated herein by reference.

One advantage of using chalcogenide materials is their low current and energy requirements for electrical switching. In a chalcogenide memory cell, the portion of the chalcogenide material that is switched to either the high or low resistance state is called the "filamentary portion." Generally, the "filamentary portion" corresponds to the cross-sectional area of the memory cell. Thus the "filamentary portion" is limited by lithography. In some chalcogenide memory devices, however, the "filamentary portion" can be reduced to an area that is less than the cross-sectional area of the memory cell. This can further reduce the current and energy requirements for switching.

One method of reducing the "filamentary portion" of a chalcogenide memory cell is to form smaller volumes, called "plugs," of lower resistivity in the two contacts on either side of the chalcogenide layer as disclosed, for example, in U.S. Pat. No. 6,545,903 to Wu, the disclosure of which is incorporated herein by reference. Another method of reducing "filamentary portion" is to deposit a chalcogenide material on the vertical sidewalls of two horizontal contacts separated by an insulator as disclosed, for example, in U.S. Pat. No. 6,830,952 to Lung, the disclosure of which is incorporated herein by reference. And another method of reducing the "filamentary portion" of a chalcogenide memory cell is to fabricate one of the contacts in the form of a tapered contact such that the peak of the tapered contact is adjacent to the chalcogenide layer as disclosed, for example, in U.S. Pat. No. 5,687,112 to Ovshinsky, the disclosure of which is incorporated herein by reference.

In view of the foregoing, it can be appreciated that a substantial need exists for systems and methods that can advantageously increase the packing density and performance of chalcogenide memory devices.

BRIEF SUMMARY OF THE INVENTION

One embodiment of the present invention is a memory cell. The memory cell includes a lower electrode, a chalcogenide layer, and an upper electrode. The lower electrode includes a tapered cavity that is tapered to a single location. The chalcogenide layer is deposited in a substantially uniform thickness in the tapered cavity of the lower electrode. One side of the chalcogenide layer is adjacent to the lower electrode. The upper electrode is deposited in a second cavity formed by the chalcogenide layer so that the upper electrode substantially fills the second cavity. The upper electrode is adjacent to the other side of the chalcogenide layer. Information is stored and retrieved by passing current between the upper electrode and the lower electrode.

Another embodiment of the present invention is a method for fabricating a memory cell involving anisotropic etching. A portion of a substrate is etched to form a tapered cavity that is tapered to a single location. Timed anisotropic etching is used to form the tapered cavity. The portion of the substrate is implanted with an effective element to make the portion more conductive. The conductive portion of the substrate forms a lower electrode. A chalcogenide layer is deposited in the tapered cavity of the lower electrode. The chalcogenide layer has a substantially uniform thickness. One side of the chalcogenide layer is adjacent to the lower electrode. An upper electrode is deposited in a second cavity formed by the chalcogenide layer. The upper electrode is deposited in the second cavity formed by the chalcogenide layer so that the upper electrode substantially fills the second cavity. The upper electrode is adjacent to the other side of the chalcogenide layer. Information is stored and retrieved by passing current between the upper electrode and the lower electrode.

Another embodiment of the present invention is a method for fabricating a memory cell involving sidewall-application. A portion of a dielectric is etched to form a pore for the memory cell. A lower electrode is deposited on the sidewalls of the dielectric and in the pore to form a tapered cavity that is tapered to a single location. A chalcogenide layer is deposited in the tapered cavity. The chalcogenide layer has a substantially uniform thickness. One side of the chalcogenide layer is adjacent to the lower electrode. An upper electrode is deposited in a second cavity formed by the chalcogenide layer. The upper electrode is deposited in the second cavity formed by the chalcogenide layer so that the upper electrode substantially fills the second cavity. The upper electrode is adjacent to the other side of the chalcogenide layer. Information is stored and retrieved by passing current between the upper electrode and the lower electrode.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
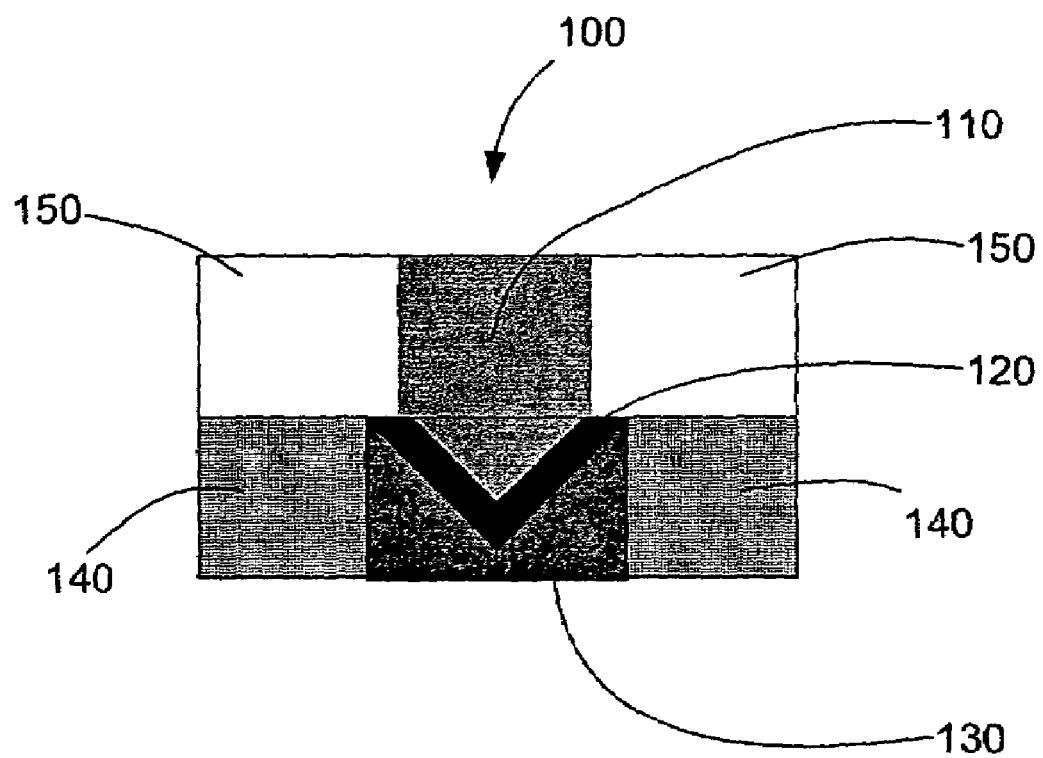
FIG. 1 is a cross-sectional view of a chalcogenide-applied memory cell where a tapered cavity is formed in the lower electrode through anisotropic etching and chalcogenide material and an upper electrode are deposited in the cavity in order to reduce the effective electrical contact area of the memory cell, in accordance with a first embodiment of the present invention.

Before one or more embodiments of the invention are described in detail, one skilled in the art will appreciate that the invention is not limited in its application to the details of construction, the arrangements of components, and the arrangement of steps set forth in the following detailed description or illustrated in the drawings. The invention is capable of other embodiments and of being practiced or being carried out in various ways. Also, it is to be understood that the phraseology and terminology used herein is for the purpose of description and should not be regarded as limiting.

FIG. 1 is a cross-sectional view of a first embodiment of a chalcogenide-applied memory cell 100 where a tapered cavity is formed in lower electrode 130 through anisotropic etching and chalcogenide material and upper electrode 110 are deposited in the cavity in order to reduce the effective electrical contact area of memory cell 100, in accordance with a first embodiment of the present invention. The tapered cavity is tapered so that the cross-sectional area of the cavity decreases uniformly from the opening of the cavity to a single location at the other end of the cavity. The cavity can include but is not limited to a shape substantially similar to a cone or pyramid. Memory cell 100 includes upper electrode 110, chalcogenide layer 120, and lower electrode 130. Memory cell 100 is isolated from other memory cells by substrate 140 and dielectric 150.

Depositing chalcogenide layer 120 and upper electrode 110 in the cavity formed in lower electrode 130 produces a tapered upper electrode 110 coated by chalcogenide layer 120. Chalcogenide layer 120 is deposited in a substantially uniform thickness and is, therefore, also tapered. In general, the smaller the area within a cross-section of volume, the higher the current density within that cross-section. Thus, the tip of tapered upper electrode 110 has the highest current density and applies this current density to the tip of chalcogenide layer 120. The "filamentary portion" of chalcogenide layer 120 is reduced to the tip of chalcogenide layer 120. As a result, the effective electrical contact area of memory cell 100 is reduced to the tip of chalcogenide layer 120.

Reducing the effective electrical contact area of memory cell 100 to the tip of chalcogenide layer 120 allows the driving current of memory cell 100 to be reduced compared to the current needed for the plug type memory. Reducing the effective electrical contact area of memory cell 100 also means that the electrical properties of memory cell 100 are less dependent on the limitations of the lithography process.

Figure 2A:
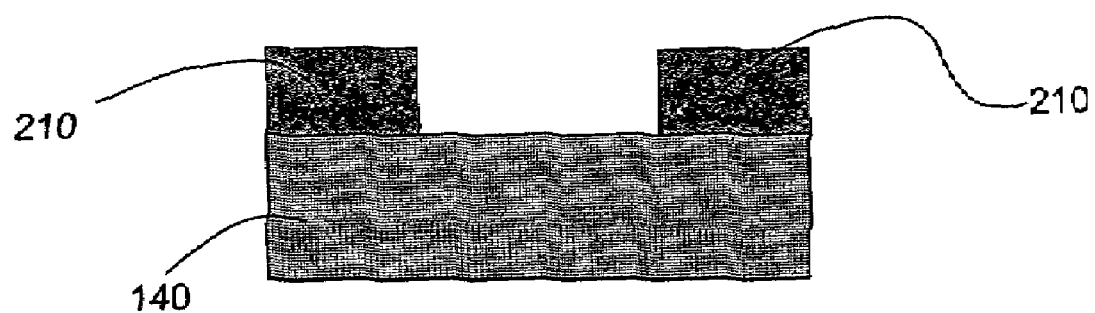
FIGS. 2A-2E show a method of fabrication of a chalcogenide-applied memory cell where a tapered cavity is formed in the lower electrode through anisotropic etching and chalcogenide material and an upper electrode are deposited in the cavity in order to reduce the effective electrical contact area of the memory cell, in accordance with the first embodiment of the present invention.

FIGS. 2A-2E show processing steps for memory cell 100. FIG. 2A is a cross-sectional view of a mask 210 forming step of chalcogenide-applied memory cell 100, in accordance with the first embodiment of the present invention. A mask 210 is formed above substrate 140. In this step, mask 210 is hard mask or photo resistant mask, for example. Substrate 140 is silicon with its orientation described as Miller index "100," for example. Other processes, including the fabrication of other circuits, can precede the step shown in FIG. 2A.

Figure 2B:
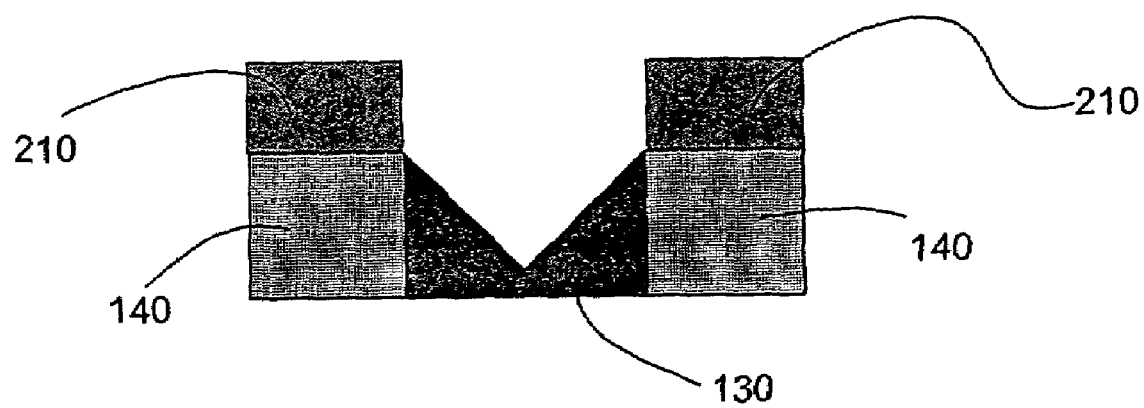

FIG. 2B is a cross-sectional view of a lower electrode cavity and lower electrode 130 forming step of chalcogenide-applied memory cell 100, in accordance with the first embodiment of the present invention. In this step, substrate 140 is etched in the area exposed by mask 210 to form a tapered cavity using a different etching rate within a different silicon orientation. The different silicon orientation is an orientation having a Miller index other than "100," for example. Lower electrode 130 is then formed by implanting an effective element into substrate 140 in the area exposed by mask 210. One skilled in the art will appreciate that lower electrode 130 is not limited to silicon implanted with an effective element. Lower electrode can include but is not limited to a metal, metalloid, semiconductor, silicide, or silicon compound, alloy, or composite.

Figure 2C:
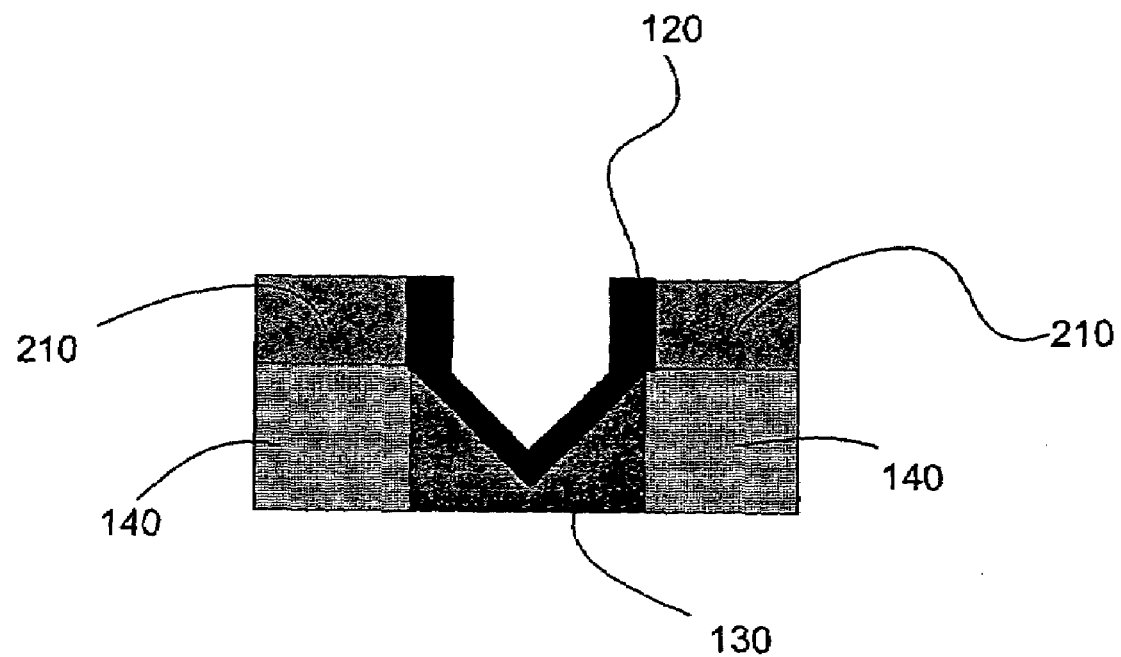

FIG. 2C is a cross-sectional view of a chalcogenide layer 120 forming step of chalcogenide-applied memory cell 100, in accordance with the first embodiment of the present invention. In this step, a chalcogenide material is deposited to form chalcogenide layer 120 in the cavity of lower electrode 130. Chalcogenide layer 120 is formed into a tapered shape adjacent to lower electrode 130.

Figure 2D:
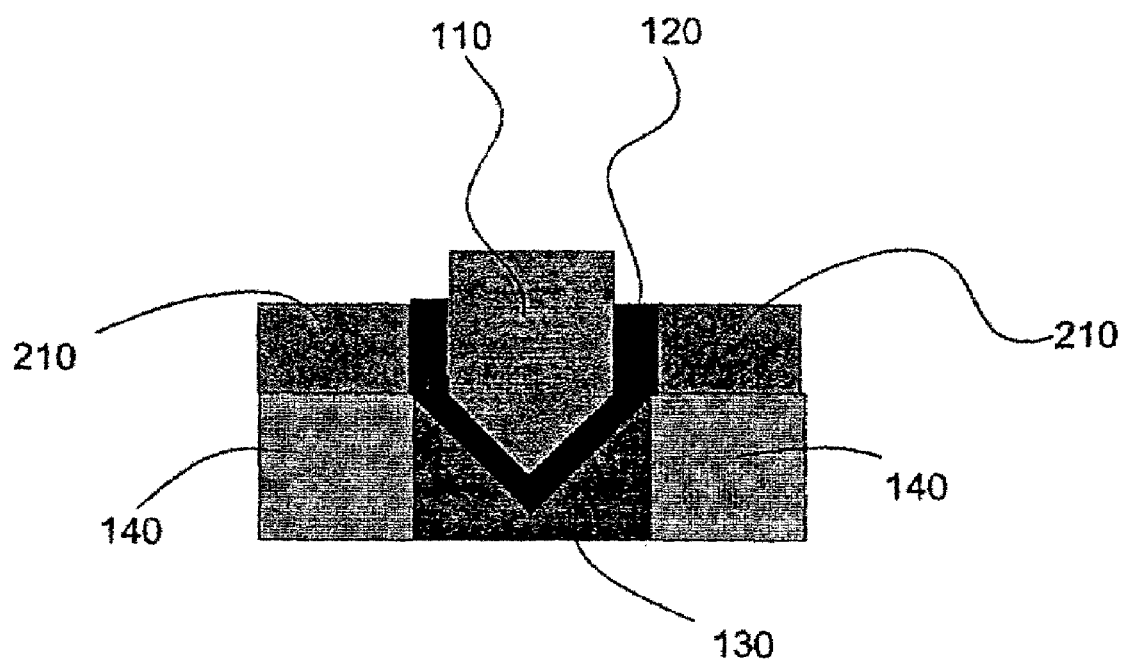

FIG. 2D is a cross-sectional view of an upper electrode 110 forming step of chalcogenide-applied memory cell 100, in accordance with the first embodiment of the present invention. In this step, a conductive material is deposited to form upper electrode 110 in the cavity formed by chalcogenide layer 120. The cavity formed by chalcogenide layer 120 is substantially filled by upper electrode 110. Upper electrode 110 is formed into a tapered shape adjacent to chalcogenide layer 120. The conductive material of upper electrode 110 can include but is not limited to a metal, metalloid, semiconductor, silicide, or silicon compound, alloy, or composite.

Figure 2E:
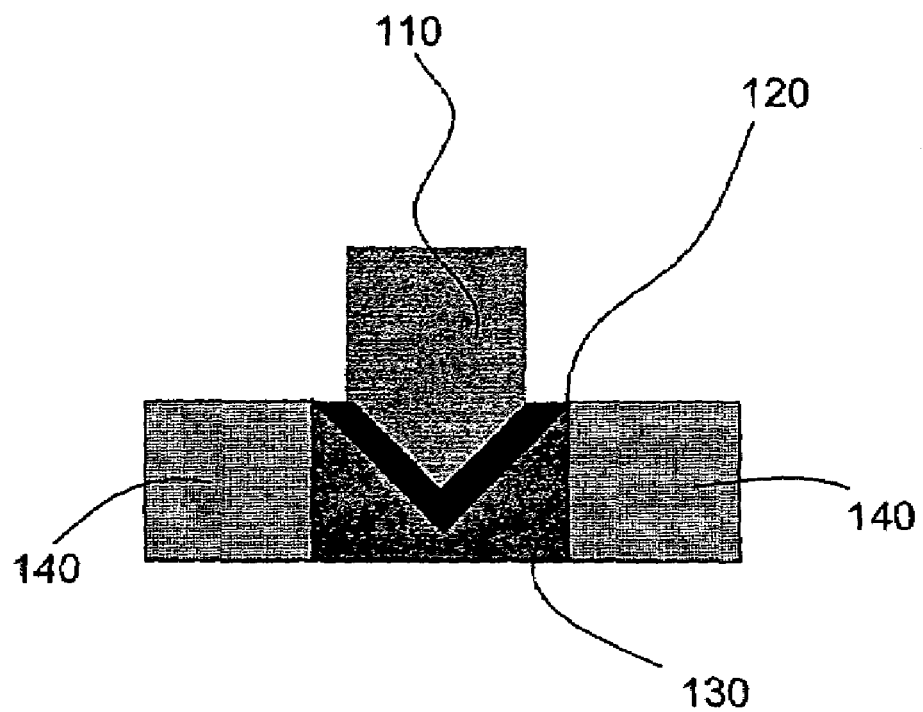

FIG. 2E is a cross-sectional view of a mask 210 removal step of chalcogenide-applied memory cell 100, in accordance with the first embodiment of the present invention. In this step, mask 210 is removed, and excess chalcogenide material and upper electrode are removed.

Memory cell 100 is finally isolated from other memory cells by depositing interlayer dielectric 150, as shown in FIG. 1. Dielectric 150 is partially removed to the level of upper electrode 110. Dielectric 150 is silicon dioxide or silicon nitride, for example, but is not limited at silicon oxide or silicon nitride.

Figure 3:
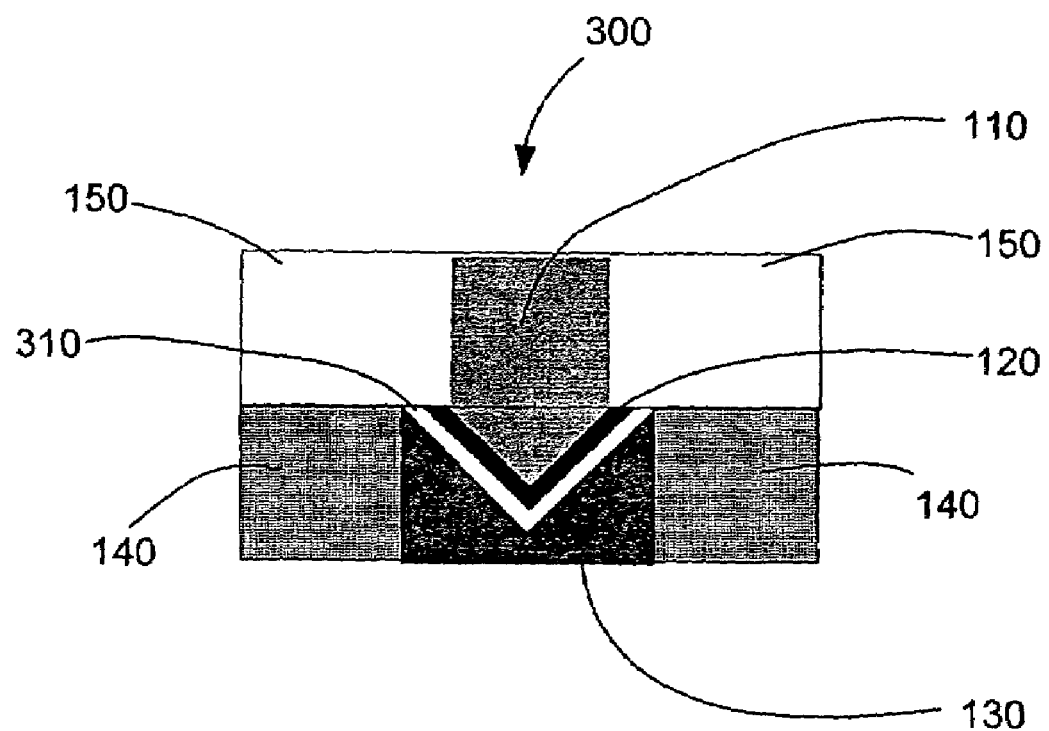
FIG. 3 is a cross-sectional view of a chalcogenide-applied memory cell where a tapered cavity is formed in the lower electrode through anisotropic etching and a dielectric material, chalcogenide material, and an upper electrode are deposited in the cavity in order to reduce the effective electrical contact area of the memory cell and prevent an undesired current path, in accordance with a second embodiment of the present invention.

FIG. 3 is a cross-sectional view of a chalcogenide-applied memory cell 300, where a tapered cavity is formed in lower electrode 130 through anisotropic etching and a dielectric material, a chalcogenide material, and upper electrode 110 are deposited in the cavity in order to reduce the effective electrical contact area of memory cell 300 and prevent an undesired current path, in accordance with a second embodiment of the present invention. The tapered cavity is tapered so that the cross-sectional area of the cavity decreases uniformly from the opening of the cavity to a single location at the other end of the cavity. The cavity can include but is not limited to a shape substantially similar to a cone or pyramid. Memory cell 300 includes upper electrode 110, chalcogenide layer 120, dielectric layer 310, and lower electrode 130. Memory cell 300 is isolated from other memory cells by substrate 140 and dielectric 150.

Depositing dielectric layer 310, chalcogenide layer 120, and upper electrode 110 in the cavity formed in lower electrode 130 produces a tapered upper electrode 110 coated by chalcogenide layer 120 and dielectric layer 310. Dielectric layer 310 and chalcogenide layer 120 are deposited in substantially uniform thicknesses and are, therefore, also tapered. As in memory cell 100 of FIG. 1, the tip of tapered upper electrode 110 has the highest current density and applies this current density to the tip of chalcogenide layer 120. Tapered upper electrode 110 also applies this current density to the tip of dielectric layer 310. The "filamentary portion" of chalcogenide layer 120 is reduced to the tip of chalcogenide layer 120. As a result, the effective electrical contact area of memory cell 100 is reduced to the tip of chalcogenide layer 120. Dielectric layer 310 is used to prevent an undesired current path or crosstalk signals from lower electrode 130 to upper electrode 110.

Reducing the effective electrical contact area of memory cell 300 to the tip of chalcogenide layer 120 allows the driving current of memory cell 300 to be reduced. Reducing the effective electrical contact area of memory cell 300 also means that the electrical properties of memory cell 300 are less dependent on the limitations of the lithography process.

Figure 4A:
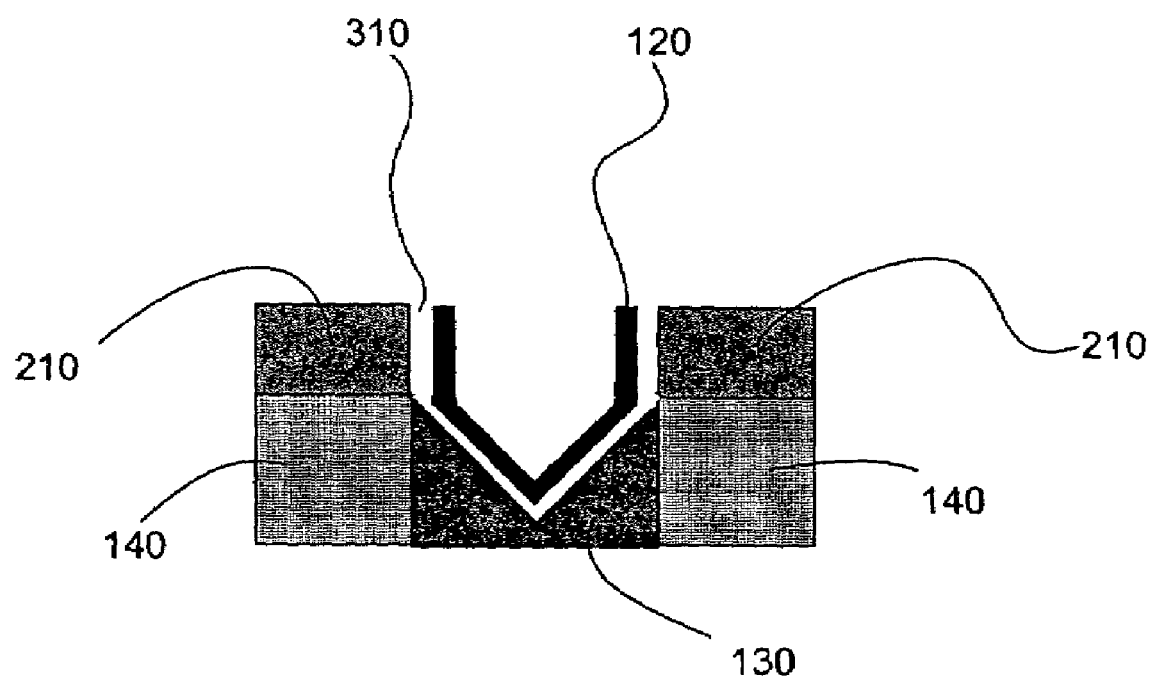
FIGS. 4A-4C show a method of fabrication of a chalcogenide-applied memory cell where a tapered cavity is formed in the lower electrode through anisotropic etching and a dielectric material, chalcogenide material, and an upper electrode are deposited in the cavity in order to reduce the effective electrical contact area of the memory cell and prevent an undesired current path, in accordance with the second embodiment of the present invention.
Figure 4B:
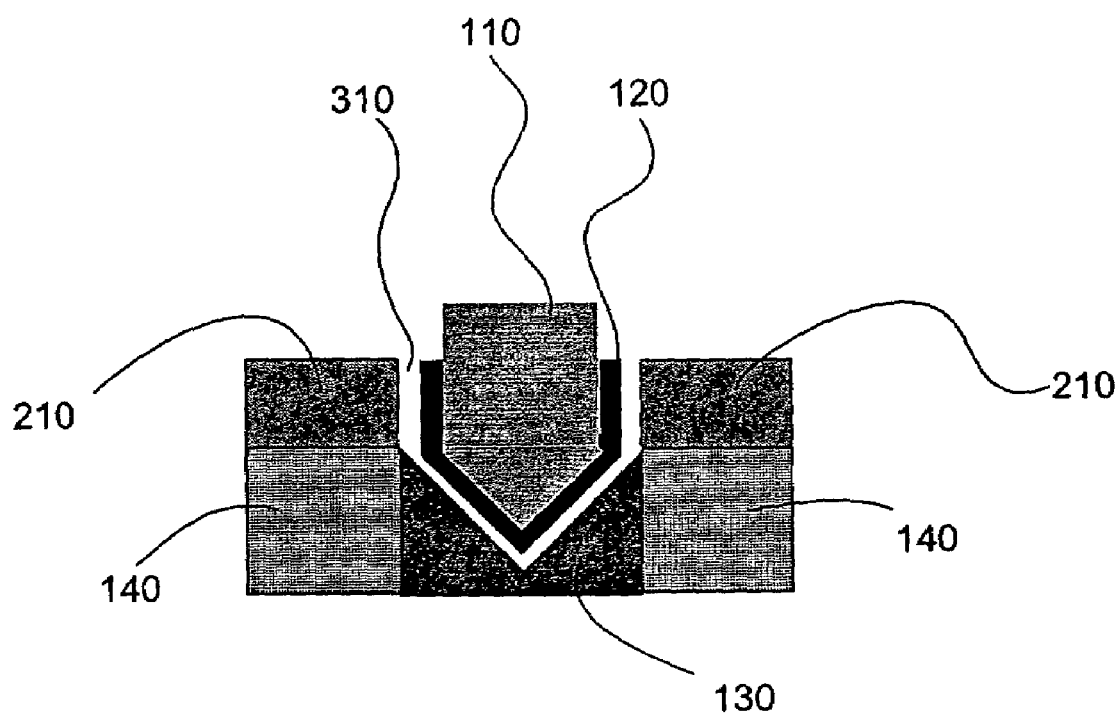

FIGS. 4A and 4B show mask 210, lower electrode cavity, and lower electrode 130 forming steps of memory cell 300, as well as of memory cell 100 shown in FIG. 1. FIG. 4A is a cross-sectional view of a dielectric layer 310 and chalcogenide layer 120 forming step of chalcogenide-applied memory cell 300 that includes a tapered dielectric layer 310, in accordance with the second embodiment of the present invention. In this step, a dielectric material is deposited to form dielectric layer 310 in the cavity of lower electrode 130. The dielectric material is an oxide, for example. Dielectric layer 310 is formed into a tapered shape adjacent to lower electrode 130. A chalcogenide material is then deposited to form chalcogenide layer 120 in the cavity formed by dielectric layer 310. Chalcogenide layer 120 is formed into a tapered shape adjacent to dielectric layer 310.

FIG. 4B is a cross-sectional view of an upper electrode 110 forming step of chalcogenide-applied memory cell 300 that includes a tapered dielectric layer 310, in accordance with the second embodiment of the present invention. In this step, a conductive material is deposited to form upper electrode 110 in the cavity formed by chalcogenide layer 120. The cavity formed by chalcogenide layer 120 is substantially filled by upper electrode 110. Upper electrode 110 is formed into a tapered shape adjacent to chalcogenide layer 120. The conductive material of upper electrode 110 can include but is not limited to a metal, metalloid, semiconductor, silicide, or silicon compound, alloy, or composite.

Figure 4C:
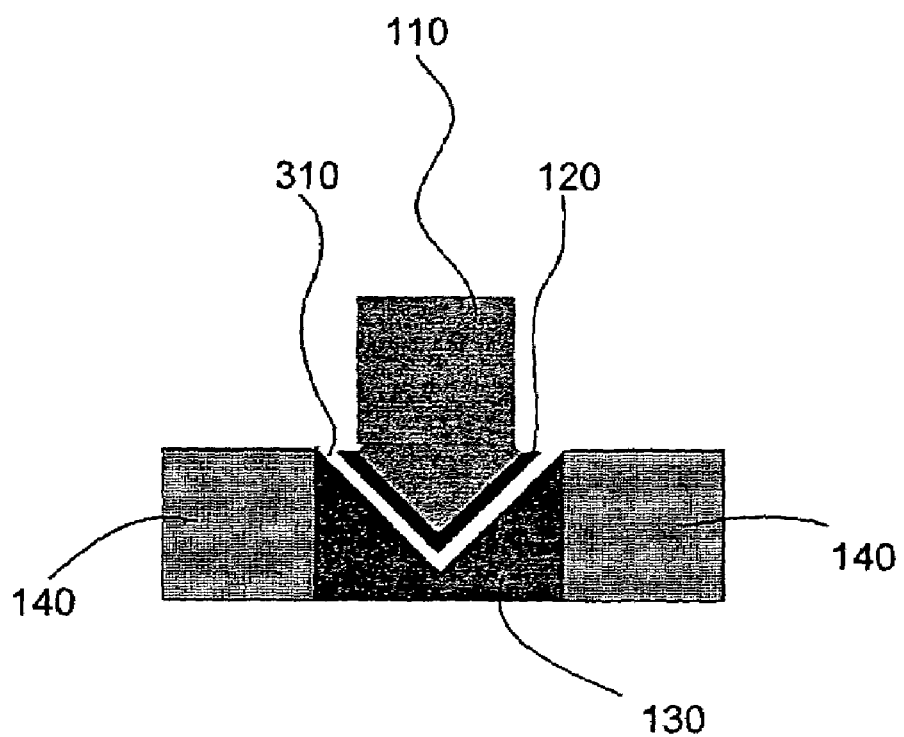

FIG. 4C is a cross-sectional view of a mask removal step of chalcogenide-applied memory cell 300 that includes tapered dielectric layer 310, in accordance with the second embodiment of the present invention. In this step, mask 210 is removed, and excess dielectric material, chalcogenide material and upper electrode are removed.

Memory cell 300 is finally isolated from other memory cells by depositing interlayer dielectric 150, as shown in FIG. 3. Dielectric 150 is partially removed to the level of upper electrode 110. Dielectric 150 is silicon dioxide or silicon nitride, for example, but is not limited at silicon oxide or silicon nitride.

Figure 5:
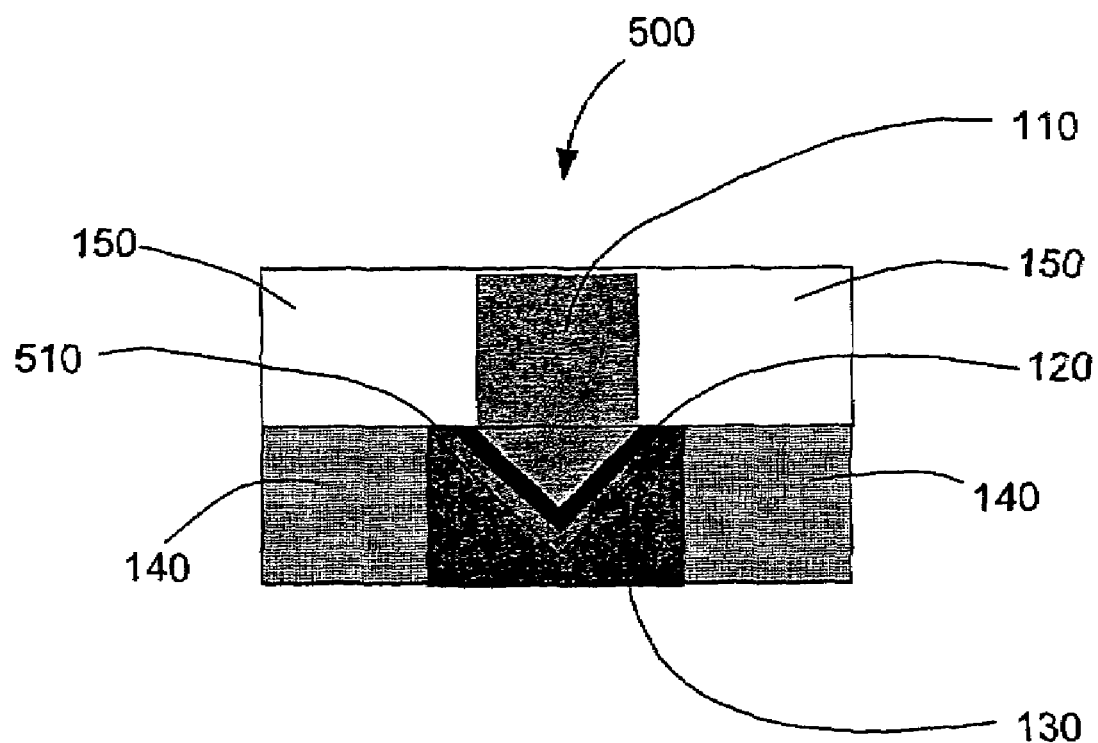
FIG. 5 is a cross-sectional view of a chalcogenide-applied memory cell where a tapered cavity is formed in the lower electrode through anisotropic etching and a conductive material, chalcogenide material, and an upper electrode are deposited in the cavity in order to reduce the effective electrical contact area of the memory cell and prevent an undesired current path, in accordance with a third embodiment of the present invention.

FIG. 5 is a cross-sectional view of a chalcogenide-applied memory cell 500 where a tapered cavity is formed in lower electrode 130 through anisotropic etching and a conductive material, chalcogenide material, and an upper electrode 110 are deposited in the cavity in order to reduce the effective electrical contact area of memory cell 500 and prevent an undesired current path, in accordance with a third embodiment of the present invention. The tapered cavity is tapered so that the cross-sectional area of the cavity decreases uniformly from the opening of the cavity to a single location at the other end of the cavity. The cavity can include but is not limited to a shape substantially similar to a cone or pyramid. Memory cell 500 includes upper electrode 110, chalcogenide layer 120, conductive layer 510, and lower electrode 130. Memory cell 510 is isolated from other memory cells by substrate 140 and dielectric 150.

Depositing conductive layer 510, chalcogenide layer 120, and upper electrode 110 in the cavity formed in lower electrode 130 produces a tapered upper electrode 110 coated by chalcogenide layer 120 and conductive layer 510. Conductive layer 510 and chalcogenide layer 120 are deposited in substantially uniform thicknesses and are, therefore, also tapered. As in memory cell 100 of FIG. 1, the tip of tapered upper electrode 110 has the highest current density and applies this current density to the tip of chalcogenide layer 120. Tapered upper electrode 110 also applies this current density to the tip of conductive layer 510. The "filamentary portion" of chalcogenide layer 120 is reduced to the tip of chalcogenide layer 120. As a result, the effective electrical contact area of memory cell 100 is reduced to the tip of chalcogenide layer 120.

Conductive layer 510 is used to prevent an undesired current path or crosstalk signals from lower electrode 130 to upper electrode 110. Conductive layer 510 is a different type of conductive material than lower electrode 130. Conductive layer 510 is, for example, p-type doped silicon and lower electrode 130 is n-type doped silicon. Conductive layer 510 and lower electrode 130 then form a p-n junction, or a diode, and undesired current flow is prevented from lower electrode 130 to upper electrode 110.

Reducing the effective electrical contact area of memory cell 500 to the tip of chalcogenide layer 120 allows the driving current of memory cell 500 to be reduced. Reducing the effective electrical contact area of memory cell 500 also means that the electrical properties of memory cell 500 are less dependent on the limitations of the lithography process.

Figure 6A:
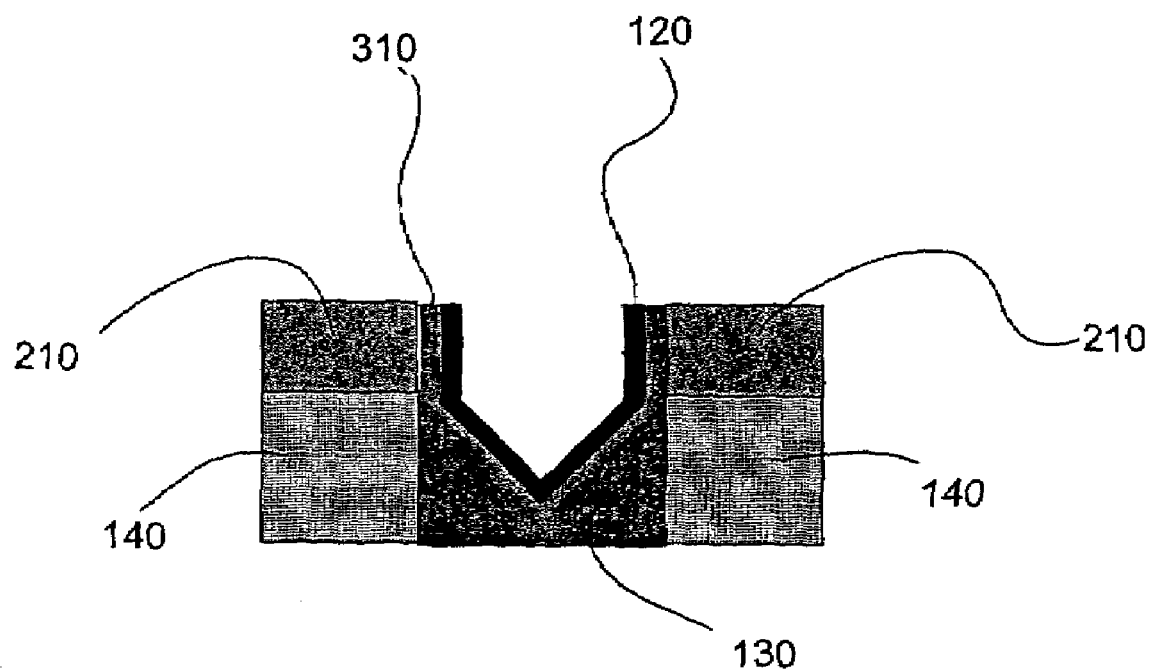
FIGS. 6A-6C show a method of fabrication of a chalcogenide-applied memory cell where a tapered cavity is formed in the lower electrode through anisotropic etching and a conductive material, chalcogenide material, and an upper electrode are deposited in the cavity in order to reduce the effective electrical contact area of the memory cell and prevent an undesired current path, in accordance with the third embodiment of the present invention.
Figure 6B:
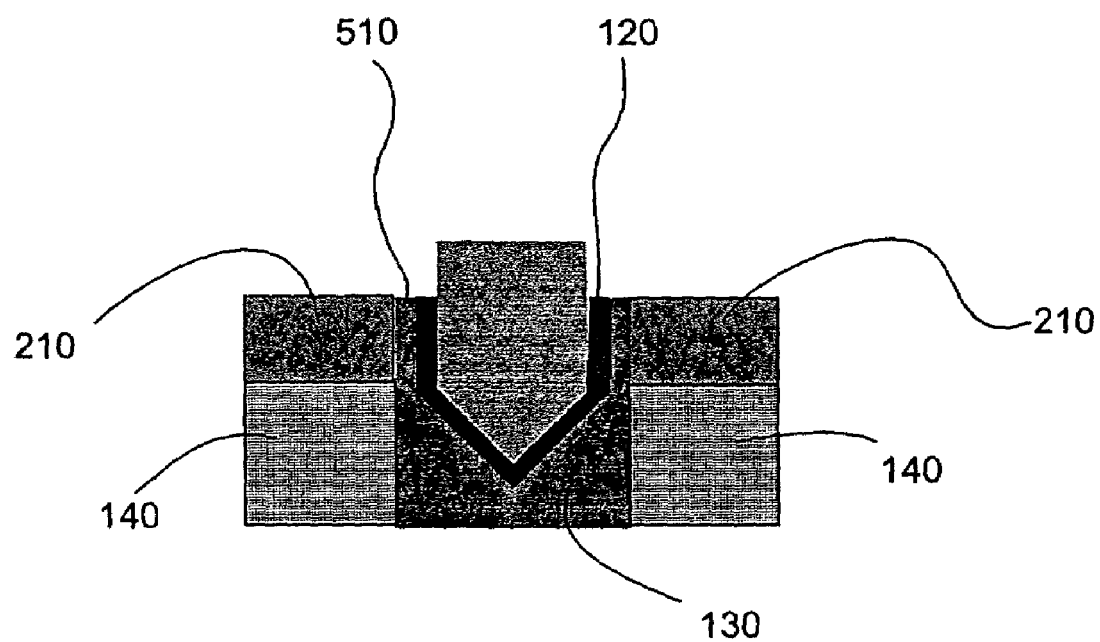

FIGS. 6A and 6B show mask 210, lower electrode cavity, and lower electrode 130 forming steps of memory cell 500, as well as of memory cell 100 shown in FIG. 1 and memory cell 300 shown in FIG. 3. FIG. 6A is a cross-sectional view of a conductive layer 510 and chalcogenide layer 120 forming step of chalcogenide-applied memory cell 500 that includes a tapered conductive layer 510, in accordance with the third embodiment of the present invention. In this step, a conductive material is deposited to form conductive layer 510 in the cavity of lower electrode 130. The conductive material is silicon doped with an effective element, for example. Conductive layer 510 is formed into a tapered shape adjacent to lower electrode 130. A chalcogenide material is then deposited to form chalcogenide layer 120 in the cavity formed by conductive layer 510. Chalcogenide layer 120 is formed into a tapered shape adjacent to conductive layer 510.

FIG. 6B is a cross-sectional view of an upper electrode 110 forming step of chalcogenide-applied memory cell 500 that includes a tapered conductive layer 510, in accordance with the third embodiment of the present invention. In this step, a conductive material is deposited to form upper electrode 110 in the cavity formed by chalcogenide layer 120. The cavity formed by chalcogenide layer 120 is substantially filled by upper electrode 110. Upper electrode 110 is formed into a tapered shape adjacent to chalcogenide layer 120. The conductive material of upper electrode 110 can include but is not limited to a metal, metalloid, semiconductor, silicide, or silicon compound, alloy, or composite.

Figure 6C:
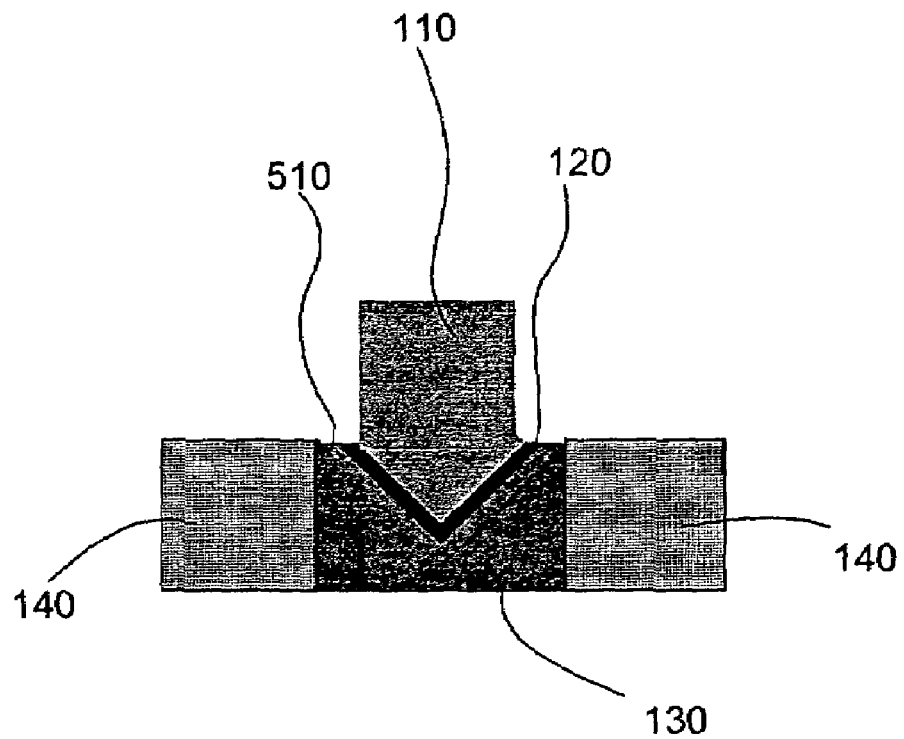

FIG. 6C is a cross-sectional view of a mask removal step of chalcogenide-applied memory cell 500 that includes tapered conductive layer 510, in accordance with the third embodiment of the present invention. In this step, mask 210 is removed, and excess conductive material, chalcogenide material and upper electrode are removed.

Memory cell 500 is finally isolated from other memory cells by depositing interlayer dielectric 150, as shown in FIG. 5. Dielectric 150 is reduced through chemical mechanical polishing (CMP) to the level of upper electrode 110. Dielectric 150 is silicon dioxide or silicon nitride, for example.

Figure 7:
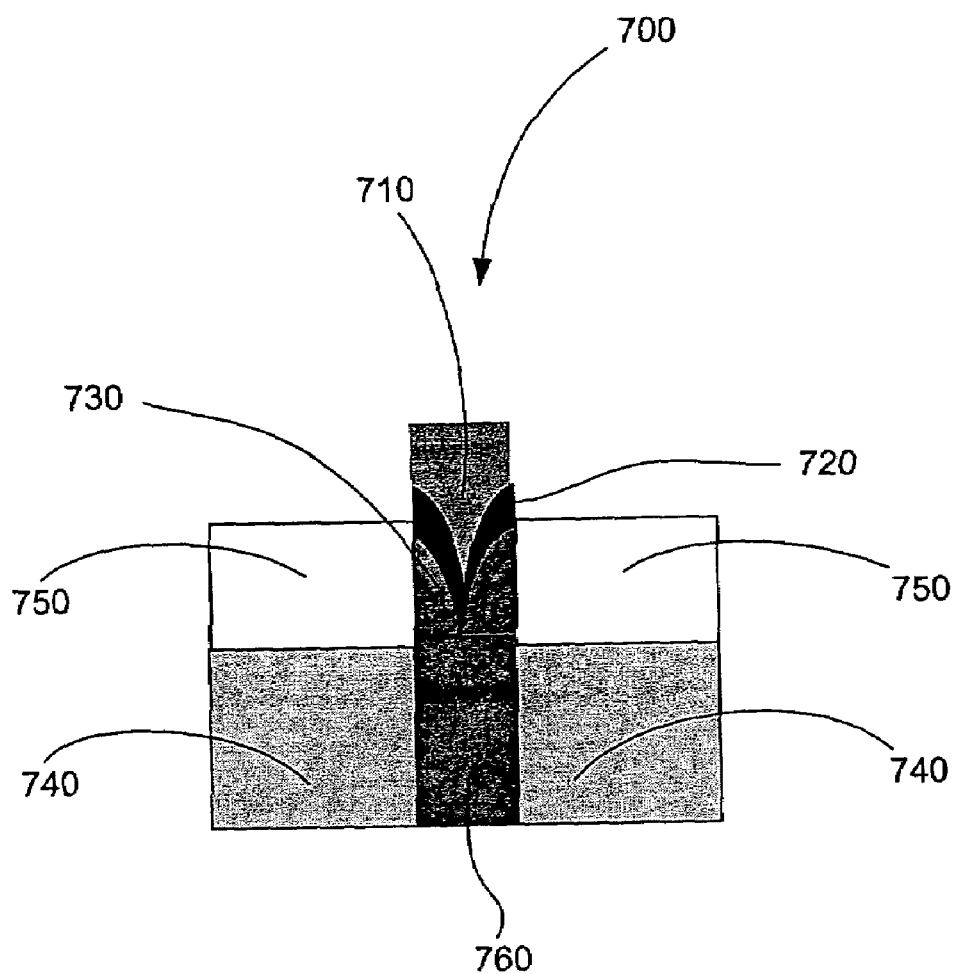
FIG. 7 is a cross-sectional view of a chalcogenide-applied memory cell where a tapered cavity is formed in the lower electrode through sidewall-application and chalcogenide material and an upper electrode are deposited in the cavity in order to reduce the effective electrical contact area of the memory cell, in accordance with a fourth embodiment of the present invention.

FIG. 7 is a cross-sectional view of a chalcogenide-applied memory cell 700 where a tapered cavity is formed in lower electrode 730 through sidewall-application and chalcogenide material and upper electrode 710 are deposited in the cavity in order to reduce the effective electrical contact area of the memory cell, in accordance with a fourth embodiment of the present invention. The tapered cavity is tapered so that the cross-sectional area of the cavity decreases uniformly from the opening of the cavity to a single location at the other end of the cavity. The cavity can include but is not limited to a shape substantially similar to a cone or pyramid. Memory cell 700 includes upper electrode 710, chalcogenide layer 720, and lower electrode 730. Memory cell 700 is isolated from other memory cells by interlayer dielectric 750, interlayer dielectric 740 and interlayer dielectric 770. Memory cell 700 is connected to other circuits via conductor 760.

Depositing the conductive material of lower electrode 730 over the sidewalls of a mask and dielectric 750 produces a tapered cavity in lower electrode 730. Sequentially depositing chalcogenide layer 720 and upper electrode 710 in the cavity formed in lower electrode 730 produces a tapered upper electrode 710 coated by chalcogenide layer 720. Chalcogenide layer 720 is deposited in a substantially uniform thickness and is, therefore, also tapered. In general, the smaller the area within a cross-section of volume, the higher the current density within that cross-section. Thus, the tip of tapered upper electrode 710 has the highest current density and applies this current density to the tip of chalcogenide layer 720. The "filamentary portion" of chalcogenide layer 720 is reduced to the tip of chalcogenide layer 720. As a result, the effective electrical contact area of memory cell 700 is reduced to the tip of chalcogenide layer 720.

Reducing the effective electrical contact area of memory cell 700 to the tip of chalcogenide layer 720 allows the driving current of memory cell 700 to be reduced. Reducing the effective electrical contact area of memory cell 700 also means that the electrical properties of memory cell 700 are less dependent on the limitations of the lithography process.

Figure 8A:
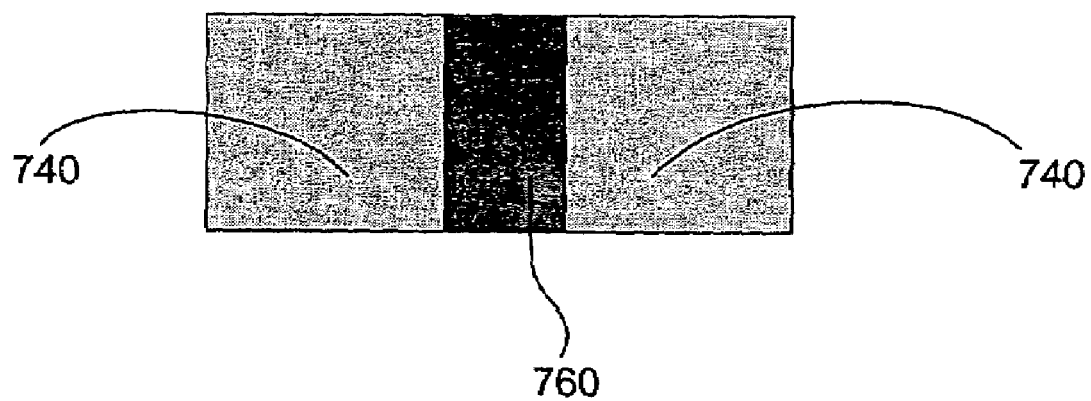
FIGS. 8A-8C show a method of fabrication of a chalcogenide-applied memory cell where a tapered cavity is formed in the lower electrode through sidewall-application and chalcogenide material and an upper electrode are deposited in the cavity in order to reduce the effective electrical contact area of the memory cell, in accordance with the fourth embodiment of the present invention.
Figure 8B:
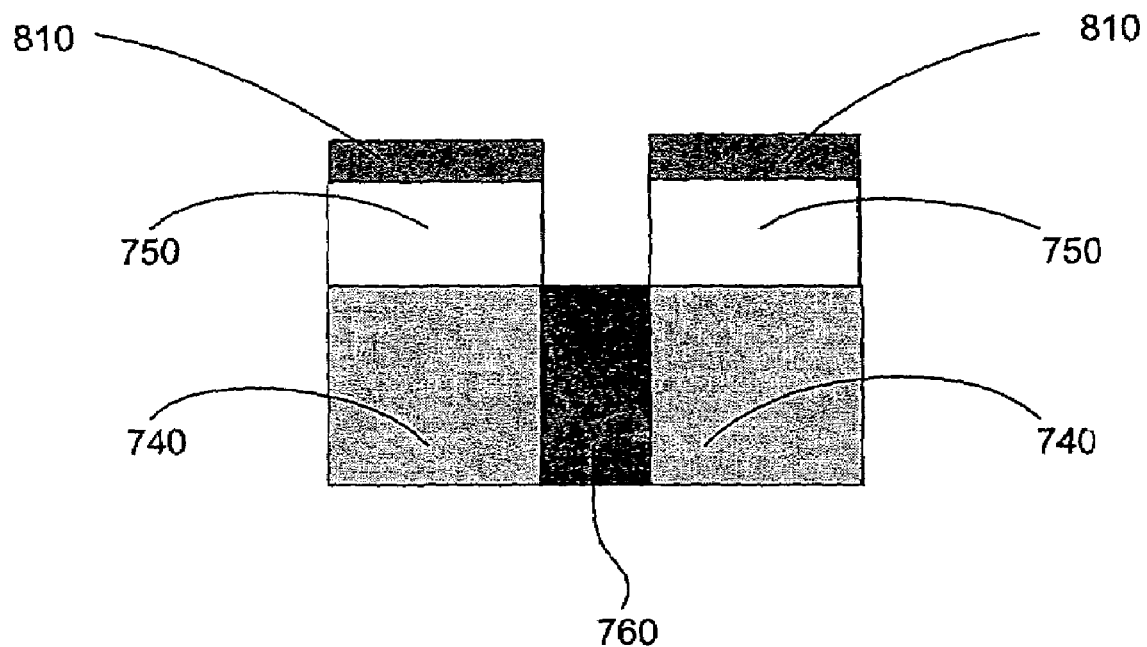
Figure 8C:
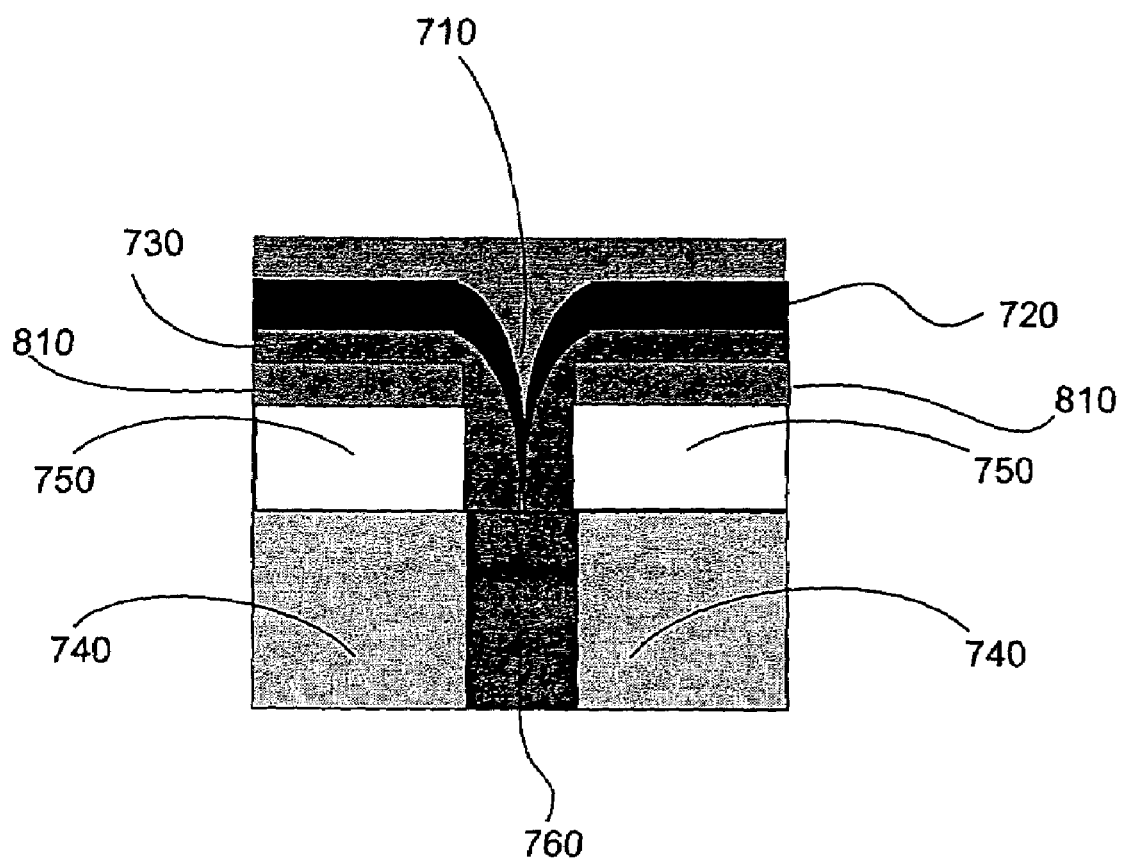

FIGS. 8A-8C show processing steps for memory cell 700. FIG. 8A is a cross-sectional view of a circuit connecting layer 1600 on which chalcogenide-applied memory cell 700 is formed, in accordance with the fourth embodiment of the present invention. Circuit connecting layer 1600 includes dielectric 740 and conductor 760. Conductor 760 is in a via hole, for example. Other processes, including the fabrication of other circuits, can precede the step shown in FIG. 8A.

FIG. 8B is a cross-sectional view of a pore forming step of chalcogenide-applied memory cell 700, in accordance with the fourth embodiment of the present invention. A pore is a volume occupied by memory cell 700. In this step, the pore is formed by depositing dielectric 750 on dielectric 740 and conductor 760. Mask 810 is then placed on dielectric 750. Mask 810 is a hard or photo resistant mask, for example. The area of mask 810 that is exposed is aligned with conductor 760. The area of mask 810 that is exposed is etched to conductor 760 in order to form the pore for memory cell 700.

FIG. 8C is a cross-sectional view of a sidewall-application step of lower electrode 730, chalcogenide layer 720, and upper electrode 710 for chalcogenide-applied memory cell 700, in accordance with the fourth embodiment of the present invention. In this step, a conductive material for lower electrode 730 is deposited on mask 810 and over the sidewalls of mask 810 and dielectric 750 producing a tapered cavity in the pore of memory cell 700. The conductive material of lower electrode 730 can include but is not limited to a metal, metalloid, semiconductor, silicide, or silicon compound, alloy, or composite.

A chalcogenide material for chalcogenide layer 720 is then deposited on top of lower electrode 730. In the pore of memory cell 700, chalcogenide layer 720 coats the cavity formed by lower electrode 730 and takes on a tapered shape adjacent to lower electrode 730.

Finally, a second conductive material for upper electrode 710 is deposited on top of chalcogenide layer 720. The second conductive material of upper electrode 710 can include but is not limited to a metal, metalloid, semiconductor, silicide, or silicon compound, alloy, or composite. The second conductive material of upper electrode 710 substantially fills the cavity formed by chalcogenide layer 730 in the pore of memory cell 700. Upper electrode 710, therefore, takes on a tapered shape adjacent to chalcogenide layer 720.

Memory cell 700 is placed in the form shown in FIG. 7 by removing mask 810 and excess material from lower electrode 730, chalcogenide layer 720, and upper electrode 710.

Memory cell 700 is finally isolated from other memory cells by depositing interlayer dielectric 770, as shown in FIG. 7. Dielectric 770 is partially removed to the level of upper electrode 710. Dielectric 770 is silicon dioxide or silicon nitride, for example, but is not limited at silicon oxide or silicon nitride.

Figure 9:
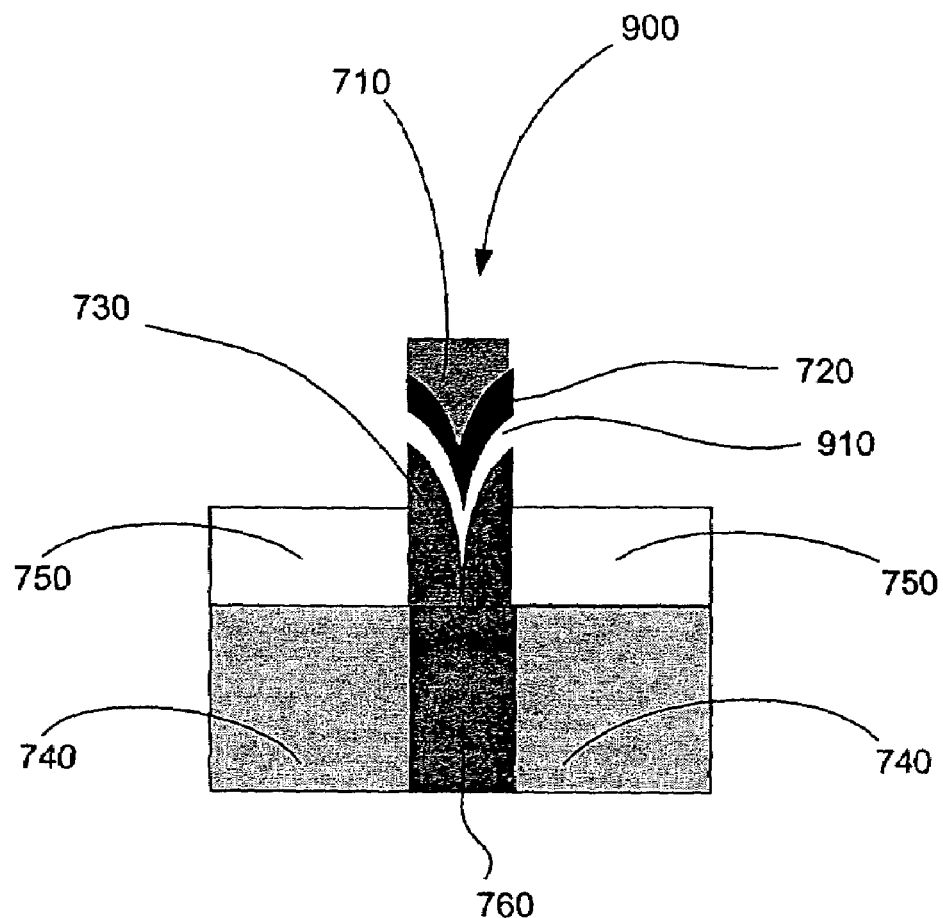
FIG. 9 is a cross-sectional view of a chalcogenide-applied memory cell where a tapered cavity is formed in the lower electrode through sidewall-application and a dielectric material, chalcogenide material, and an upper electrode are deposited in the cavity in order to reduce the effective electrical contact area of the memory cell and prevent an undesired current path, in accordance with a fifth embodiment of the present invention.

FIG. 9 is a cross-sectional view of a chalcogenide-applied memory cell 900 where a tapered cavity is formed in lower electrode 730 through sidewall-application and a dielectric material, chalcogenide material, and upper electrode 710 are deposited in the cavity in order to reduce the effective electrical contact area of memory cell 900 and prevent an undesired current path, in accordance with a fifth embodiment of the present invention. The tapered cavity is tapered so that the cross-sectional area of the cavity decreases uniformly from the opening of the cavity to a single location at the other end of the cavity. The cavity can include but is not limited to a shape substantially similar to a cone or pyramid. Memory cell 900 includes upper electrode 710, dielectric layer 910, chalcogenide layer 720, and lower electrode 730. Memory cell 900 is isolated from other memory cells by interlayer dielectric 750, interlayer dielectric 740 and interlayer dielectric 770. Memory cell 900 is connected to other circuits via conductor 760.

Depositing the conductive material of lower electrode 730 over the sidewalls of a mask and dielectric 750 produces a tapered cavity in lower electrode 730. Sequentially depositing, dielectric layer 910, chalcogenide layer 720, and upper electrode 710 in the cavity formed in lower electrode 730 produces a tapered upper electrode 710 coated by chalcogenide layer 720 and dielectric layer 910. Dielectric layer 910 and chalcogenide layer 720 are deposited in substantially uniform thicknesses and are, therefore, also tapered. As in memory cell 700 of FIG. 7, the tip of tapered upper electrode 710 has the highest current density and applies this current density to the tip of chalcogenide layer 720. Tapered upper electrode 710 also applies this current density to the tip of dielectric layer 910. The "filamentary portion" of chalcogenide layer 720 is reduced to the tip of chalcogenide layer 720. As a result, the effective electrical contact area of memory cell 900 is reduced to the tip of chalcogenide layer 720. Dielectric layer 910 is used to prevent an undesired current path or crosstalk signals from lower electrode 730 to upper electrode 710.

Reducing the effective electrical contact area of memory cell 900 to the tip of chalcogenide layer 720 allows the driving current of memory cell 900 to be reduced. Reducing the effective electrical contact area of memory cell 900 also means that the electrical properties of memory cell 900 are less dependent on the limitations of the lithography process.

Figure 10:
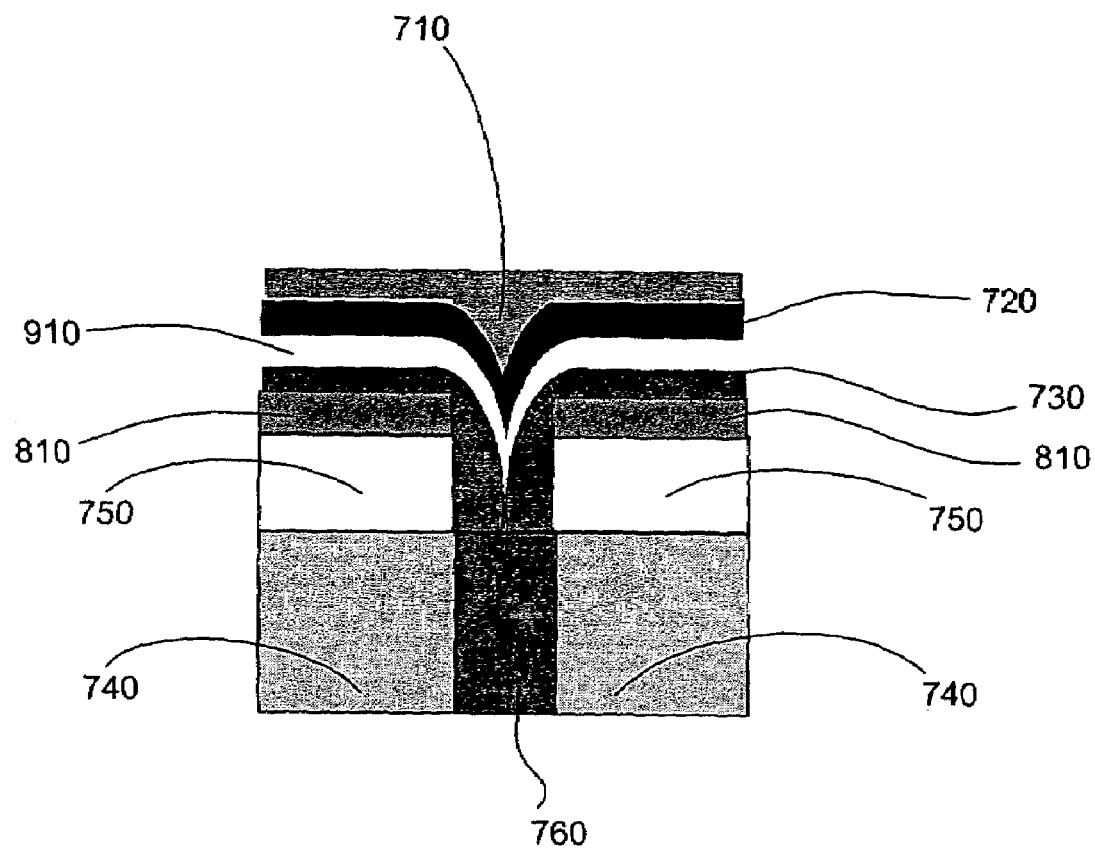
FIG. 10 is a cross-sectional view of a sidewall-application step of a lower electrode, a dielectric layer, a chalcogenide layer, and an upper electrode for a chalcogenide-applied memory cell, in accordance with a sixth embodiment of the present invention.

FIGS. 8A and 8B show the circuit connecting layer and pore forming step for memory cell 900, as well as for memory cell 700 shown in FIG. 7. FIG. 10 is a cross-sectional view of a sidewall-application step of lower electrode 730, dielectric layer 910, chalcogenide layer 720, and upper electrode 710 for chalcogenide-applied memory cell 900, in accordance with a sixth embodiment of the present invention. In this step, a conductive material for lower electrode 730 is deposited on mask 810 and over the sidewalls of mask 810 and dielectric 750 producing a tapered cavity in the pore of memory cell 700. The conductive material of lower electrode 730 can include but is not limited to a metal, metalloid, semiconductor, silicide, or silicon compound, alloy, or composite.

A dielectric material for dielectric layer 910 is deposited on top of lower electrode 730. In the pore of memory cell 900, dielectric layer 910 coats the cavity formed by lower electrode 730 and takes on a tapered shape adjacent to lower electrode 730.

A chalcogenide material for chalcogenide layer 720 is then deposited on top of dielectric layer 910. In the pore of memory cell 900, chalcogenide layer 720 coats the cavity formed by dielectric layer 910 and takes on a tapered shape adjacent to dielectric layer 910.

Finally, a second conductive material for upper electrode 710 is deposited on top of chalcogenide layer 720. The second conductive material of upper electrode 710 can include but is not limited to a metal, metalloid, semiconductor, silicide, or silicon compound, alloy, or composite. The second conductive material of upper electrode 710 substantially fills the cavity formed by chalcogenide layer 730 in the pore of memory cell 700. Upper electrode 710, therefore, takes on a tapered shape adjacent to chalcogenide layer 720.

Memory cell 900 is placed in the form shown in FIG. 9 by removing mask 810 and excess material from lower electrode 730, dielectric layer 910, chalcogenide layer 720, and upper electrode 710.

Memory cell 900 is finally isolated from other memory cells by depositing interlayer dielectric 770, as shown in FIG. 9. Dielectric 770 is partially removed to the level of upper electrode 710. Dielectric 770 is silicon dioxide or silicon nitride, for example, but is not limited at silicon oxide or silicon nitride.

Figure 11:
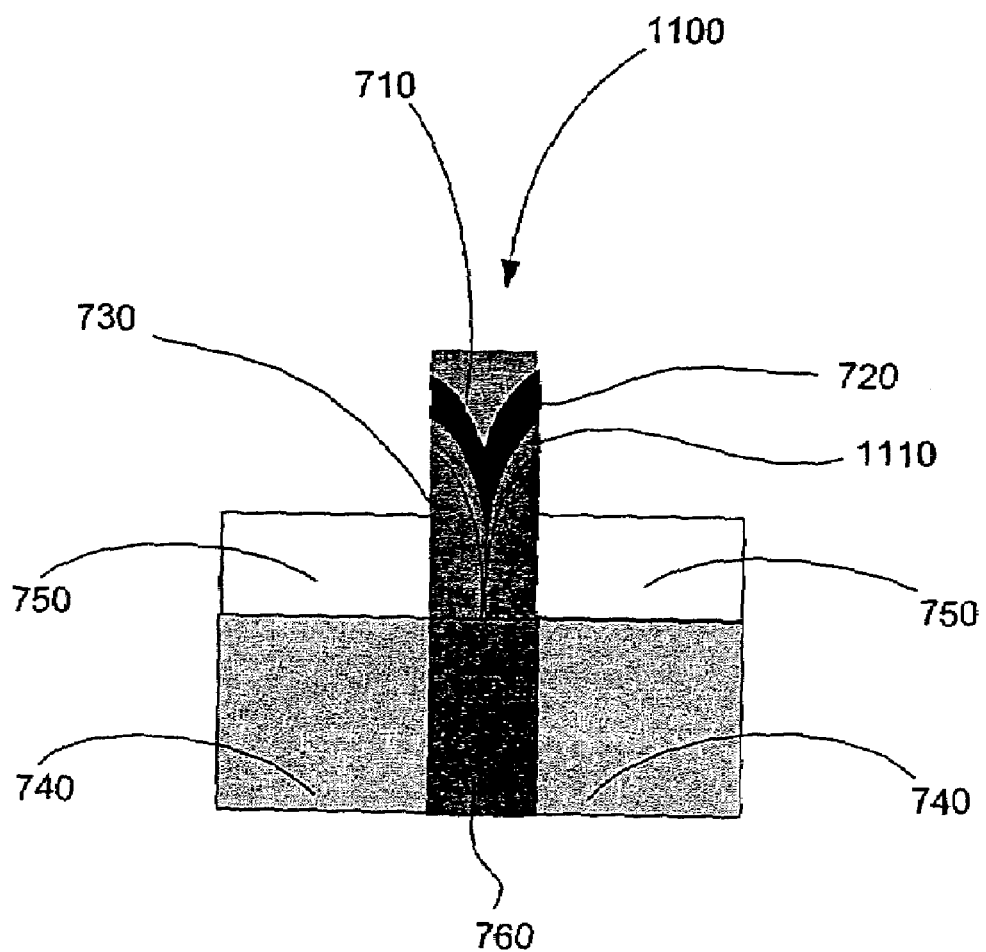
FIG. 11 is a cross-sectional view of a chalcogenide-applied memory cell where a tapered cavity is formed in the lower electrode through sidewall-application and a conductive material, chalcogenide material, and an upper electrode are deposited in the cavity in order to reduce the effective electrical contact area of the memory cell and prevent an undesired current path, in accordance with a seventh embodiment of the present invention.

FIG. 11 is a cross-sectional view of a chalcogenide-applied memory cell 1100 where a tapered cavity is formed in lower electrode 730 through sidewall-application and a conductive material, a chalcogenide material, and upper electrode 710 are deposited in the cavity in order to reduce the effective electrical contact area of memory cell 1100 and prevent an undesired current path, in accordance with a seventh embodiment of the present invention. The tapered cavity is tapered so that the cross-sectional area of the cavity decreases uniformly from the opening of the cavity to a single location at the other end of the cavity. The cavity can include but is not limited to a shape substantially similar to a cone or pyramid. Memory cell 1100 includes upper electrode 710, conductive layer 1110, chalcogenide layer 720, and lower electrode 730. Memory cell 1100 is isolated from other memory cells by interlayer dielectric 750, interlayer dielectric 740 and interlayer dielectric 770. Memory cell 1100 is connected to other circuits via conductor 760.

Depositing the conductive material of lower electrode 730 over the sidewalls of a mask and dielectric 750 produces a tapered cavity in lower electrode 730. Sequentially depositing conductive layer 1110, chalcogenide layer 720, and upper electrode 710 in the cavity formed in lower electrode 730 produces a tapered upper electrode 710 coated by chalcogenide layer 720 and conductive layer 1110. Conductive layer 1110 and chalcogenide layer 720 are deposited in substantially uniform thicknesses and are, therefore, also tapered. As in memory cell 700 of FIG. 7, the tip of tapered upper electrode 710 has the highest current density and applies this current density to the tip of chalcogenide layer 720. Tapered upper electrode 710 also applies this current density to the tip of conductive layer 1110. The "filamentary portion" of chalcogenide layer 720 is reduced to the tip of chalcogenide layer 720. As a result, the effective electrical contact area of memory cell 1100 is reduced to the tip of chalcogenide layer 720.

Conductive layer 1110 is used to prevent an undesired current path or crosstalk signals from lower electrode 730 to upper electrode 710. Conductive layer 1110 is a different type of conductive material than lower electrode 730. Conductive layer 1110 is, for example, p-type doped silicon and lower electrode 730 is n-type doped silicon. Conductive layer 1110 and lower electrode 730 then form a p-n junction, or a diode, and undesired current flow is prevented from lower electrode 730 to upper electrode 710.

Reducing the effective electrical contact area of memory cell 1100 to the tip of chalcogenide layer 720 allows the driving current of memory cell 1100 to be reduced. Reducing the effective electrical contact area of memory cell 1100 also means that the electrical properties of memory cell 1100 are less dependent on the limitations of the lithography process.

Figure 12:
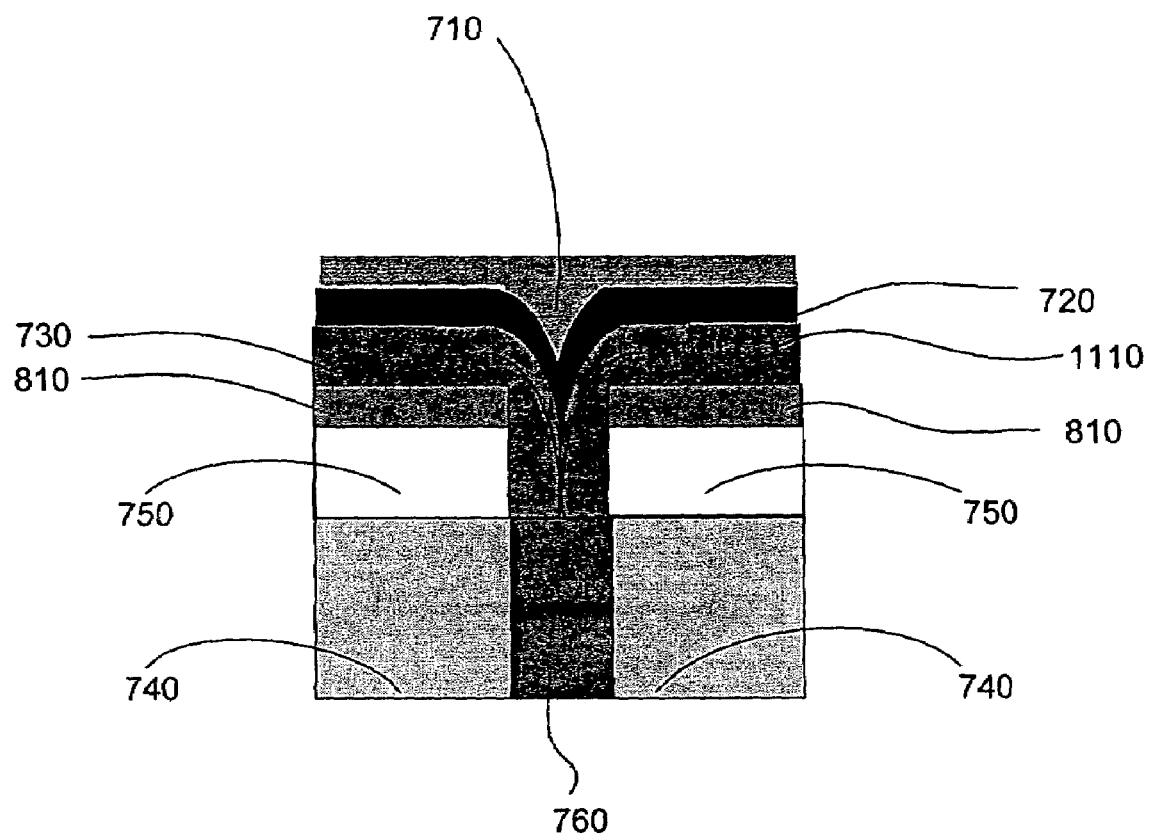
FIG. 12 is a cross-sectional view of a sidewall-application step of a lower electrode, a conductive layer, a chalcogenide layer, and an upper electrode for a chalcogenide-applied memory cell, in accordance with an eighth embodiment of the present invention.

FIGS. 8A and 8B show the circuit connecting layer and pore forming step for memory cell 1100, as well as for memory cell 700 shown in FIG. 7 and memory cell 900 shown in FIG. 9. FIG. 12 is a cross-sectional view of a sidewall-application step of lower electrode 730, conductive layer 1110, a chalcogenide layer 720, and upper electrode 730 for chalcogenide-applied memory cell 1100, in accordance with an eighth embodiment of the present invention.

In this step, conductive material for lower electrode 730 is deposited on mask 810 and over the sidewalls of mask 810 and dielectric 750 producing a tapered cavity in the pore of memory cell 700. The conductive material of lower electrode 730 can include but is not limited to a metal, metalloid, semiconductor, silicide, or silicon compound, alloy, or composite.

A second conductive material for conductive layer 1110 is deposited on top of lower electrode 730. In the pore of memory cell 1100, conductive layer 1110 coats the cavity formed by lower electrode 730 and takes on a tapered shape adjacent to lower electrode 730.

A chalcogenide material for chalcogenide layer 720 is then deposited on top of conductive layer 1110. In the pore of memory cell 1100, chalcogenide layer 720 coats the cavity formed by conductive layer 1110 and takes on a tapered shape adjacent to conductive layer 1110.

Finally, a third conductive material for upper electrode 710 is deposited on top of chalcogenide layer 720. The third conductive material of upper electrode 710 can include but is not limited to a metal, metalloid, semiconductor, silicide, or silicon compound, alloy, or composite. The third conductive material of upper electrode 710 substantially fills the cavity formed by chalcogenide layer 730 in the pore of memory cell 1100. Upper electrode 710, therefore, takes on a tapered shape adjacent to chalcogenide layer 720.

Memory cell 1100 is placed in the form shown in FIG. 11 by removing mask 810 and excess material from lower electrode 730, conductive layer 1110, chalcogenide layer 720, and upper electrode 710.

Memory cell 1100 is finally isolated from other memory cells by depositing interlayer dielectric 770, as shown in FIG. 11. Dielectric 770 is partially removed to the level of upper electrode 710. Dielectric 770 is silicon dioxide or silicon nitride, for example, but is not limited at silicon oxide or silicon nitride.

Systems and methods in accordance with an embodiment of the present invention disclosed herein can advantageously reduce the contact area of chalcogenide-applied memory cell and prevent undesired current flow.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A chalcogenide memory cell, comprising:
a lower electrode, comprising a tapered cavity having sidewalls that taper substantially to a single location;
a chalcogenide layer, formed in the tapered cavity of the lower electrode with a first side of the chalcogenide layer being in close proximity to the lower electrode wherein a distance between the first side of the chalcogenide layer and the lower electrode is substantially uniform over an entire area of the first side of the chalcogenide layer; and
an upper electrode, formed in a second cavity formed by the chalcogenide layer so that the upper electrode substantially fills the second cavity, with the upper electrode adjacent to a second side of the chalcogenide layer.

2. The memory cell of claim 1, wherein the tapered cavity is tapered so that the cross-sectional area of the tapered cavity decreases uniformly from an opening of the tapered cavity to the single location at another end of the tapered cavity.

3. The memory cell of claim 1, wherein the tapered cavity comprises one of a substantially conic shape and a substantially pyramid shape.

4. The memory cell of claim 1, wherein the lower electrode comprises one or more of a metal, metalloid, semiconductor, silicide, silicon compound, silicon alloy, and silicon composite.

5. The memory cell of claim 1, wherein the upper electrode comprises one or more of a metal, metalloid, semiconductor, silicide, silicon compound, silicon alloy, and silicon composite.

6. The memory cell of claim 1, further comprising a dielectric layer, formed in the tapered cavity of the lower electrode, a first side of the dielectric layer being adjacent to the lower electrode, and a second side of the dielectric layer being adjacent to the first side of the chalcogenide layer.

7. The memory cell of claim 1, further comprising a conductive layer, formed in the tapered cavity of the lower electrode, a first side of the conductive layer being adjacent to the lower electrode, and a second side of the conductive layer being adjacent to the first side of the chalcogenide layer.

8. The memory cell of claim 7, wherein the conductive layer comprises a p-type doped material and the lower electrode comprises an n-type doped material so that the conductive layer and the lower electrode form a p-n junction.

9. The memory cell of claim 7, wherein the conductive layer comprises an n-type doped material and the lower electrode comprises a p-type doped material so that the conductive layer and the lower electrode form a p-n junction.

10. A method for fabricating a chalcogenide memory cell, comprising:
patterning a portion of a substrate to form a tapered cavity having sidewalls that taper substantially to a single location;
introducing an effective element into the substrate portion to make the portion more conductive, wherein the portion forms a lower electrode;
forming a chalcogenide layer in the tapered cavity, a first side of the chalcogenide layer being in close proximity to the lower electrode wherein a distance between the first side of the chalcogenide layer and the lower electrode is substantially uniform over an entire area of the first side of the chalcogenide layer; and
forming an upper electrode in a second cavity formed by the chalcogenide layer, the upper electrode being formed in the second cavity so that the upper electrode substantially fills the second cavity and the upper electrode is adjacent to a second side of the chalcogenide layer.

11. The method of claim 10, wherein the lower electrode comprises one or more of a metal, metalloid, semiconductor, silicide, silicon compound, silicon alloy, and silicon composite.

12. The method of claim 10, wherein the upper electrode comprises one or more of a metal, metalloid, semiconductor, silicide, silicon compound, silicon alloy, and silicon composite.

13. The method of claim 10, further comprising forming a dielectric layer in the tapered cavity, a first side of the dielectric layer being adjacent to the lower electrode, and a second side of the dielectric layer being adjacent to the first side of the chalcogenide layer.

14. The method of claim 10, further comprising forming a conductive layer in the tapered cavity, a first side of the conductive layer being adjacent to the lower electrode, and a second side of the conductive layer being adjacent to the first side of the chalcogenide layer.

15. The method of claim 14, wherein the conductive layer comprises a p-type doped material and the lower electrode comprises an n-type doped material such that the conductive layer and the lower electrode form a p-n junction.

16. A method for fabricating a chalcogenide memory cell, comprising:
patterning a portion of a dielectric to form a pore for the memory cell;
forming a lower electrode on the sidewalls of the dielectric and in the pore to form a tapered cavity having sidewalls that taper substantially to a single location;
forming a chalcogenide layer in the tapered cavity, a first side of the chalcogenide layer being in close proximity to the lower electrode wherein a distance between the first side of the chalcogenide layer and the lower electrode is substantially uniform over an entire area of the first side of the chalcogenide layer; and
forming an upper electrode in a second cavity formed by the chalcogenide layer, the upper electrode being formed in the second cavity so that the upper electrode substantially fills the second cavity and the upper electrode is adjacent to a second side of the chalcogenide layer.

17. The method of claim 16, wherein the upper electrode comprises one or more of a metal, metalloid, semiconductor, silicide, silicon compound, silicon alloy, and silicon composite.

18. The method of claim 16, further comprising forming a dielectric layer in the tapered cavity, a first side of the dielectric layer being adjacent to the lower electrode, and a second side of the dielectric layer being adjacent to the first side of the chalcogenide layer.

19. The method of claim 16, further comprising forming a conductive layer in the tapered cavity, a first side of the conductive layer being adjacent to the lower electrode, and a second side of the conductive layer being adjacent to the first side of the chalcogenide layer.

20. The method of claim 19, wherein the conductive layer comprises a p-type doped material and the lower electrode comprises an n-type doped material such that the conductive layer and the lower electrode form a p-n junction.

* * * * *